United States Patent
Chen et al.

(10) Patent No.: US 11,362,099 B2
(45) Date of Patent: Jun. 14, 2022

(54) NON-VOLATILE MEMORY DEVICE AND MANUFACTURING METHOD THEREOF

(71) Applicant: Powerchip Semiconductor Manufacturing Corporation, Hsinchu (TW)

(72) Inventors: Ching-Hua Chen, Hsinchu (TW); Bing-Chen Ji, Taichung (TW); Shun-Tsung Yu, Hsinchu County (TW); Ming-Yuan Lin, Hsinchu (TW); Han-Chao Lai, Hsinchu County (TW); Jih-Wen Chou, Hsinchu (TW); Chen-Chiu Hsue, Hsinchu (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 232 days.

(21) Appl. No.: 16/869,593

(22) Filed: May 8, 2020

(65) Prior Publication Data

US 2021/0265368 A1    Aug. 26, 2021

(30) Foreign Application Priority Data

Feb. 20, 2020   (TW) .................... 109105454

(51) Int. Cl.
*H01L 27/11521*   (2017.01)
*H01L 27/112*   (2006.01)

(52) U.S. Cl.
CPC .. *H01L 27/11521* (2013.01); *H01L 27/11206* (2013.01)

(58) Field of Classification Search
CPC ......... H01L 27/11521; H01L 27/11206; H01L 23/5252; H01L 27/11531; H01L 27/11517; H01L 27/11526
See application file for complete search history.

(56) References Cited

U.S. PATENT DOCUMENTS 5,095,228 A    3/1992   Galbraith et al.
5,163,180 A    11/1992  Eltoukhy et al.
(Continued)

FOREIGN PATENT DOCUMENTS

TW    200717720    5/2007
TW    201528368    7/2015

OTHER PUBLICATIONS

"Office Action of Taiwan Counterpart Application", dated Dec. 21, 2020, pp. 1-6.

*Primary Examiner* — Allison Bernstein
(74) *Attorney, Agent, or Firm* — JCIPRNET (57) ABSTRACT

A non-volatile memory device includes a substrate, a stacked structure, an anti-fuse gate, a gate dielectric layer, a first doping region, and a second doping region. The stacked structure is formed on the substrate and includes a floating gate, a select logic gate, a logic gate dielectric layer, and an inter-polysilicon layer dielectric layer. The select logic gate is disposed on the floating gate, the logic gate dielectric layer is disposed between the floating gate and the substrate, and the inter-polysilicon layer dielectric layer is disposed between the floating gate and the select logic gate. The anti-fuse gate is disposed on the substrate, and the gate dielectric layer is disposed between the anti-fuse gate and the substrate. The first doping region is formed in the substrate at one side of the floating gate. The second doping region is formed in the substrate between the floating gate and the anti-fuse gate.

28 Claims, 5 Drawing Sheets

(56) References Cited

U.S. PATENT DOCUMENTS

| | | | |
|---|---|---|---|
| 6,706,602 B2 | 3/2004 | Hsu et al. | |
| 8,508,971 B2 | 8/2013 | Chiu et al. | |
| 8,895,386 B2 * | 11/2014 | Hsu | H01L 28/20 |
| | | | 438/257 |
| 9,224,496 B2 * | 12/2015 | Chung | G11C 17/12 |
| 9,502,581 B2 | 11/2016 | Chern | |

* cited by examiner

//NON-VOLATILE MEMORY DEVICE AND MANUFACTURING METHOD THEREOF

CROSS-REFERENCE TO RELATED APPLICATION

This application claims the priority benefit of Taiwan application serial no. 109105454, filed on Feb. 20, 2020. The entirety of the above-mentioned patent application is hereby incorporated by reference herein and made a part of this specification.

BACKGROUND

Technical Field

The disclosure relates to a memory device, and in particular, to a non-volatile memory device and a manufacturing method thereof.

Description of Related Art

With the advantage that data may be stored, read, and erased a plurality of times and the stored data does not disappear after the device is powered off, the non-volatile memory device has been widely used in personal computers and electronic devices.

The non-volatile memory device may generally be divided into an erasable programmable ROM (EPROM), a one-time programmable (OTP) read-only memory, a multiple time programmable (MTP) memory device, and the like. Since the OTP read-only memory may delete noise and write data after the memory leaves the factory (that is, data may also be written by a user according to the environment in which the memory is configured), it is convenient in use.

At present, for the OTP read-only memory, in response to the trend of shrinking device size and high integration, a transistor for writing may be connected in series at one side of an anti-fuse (AF) transistor to form a two-transistor (2T) structure. During programming, a high voltage may be applied to the anti-fuse transistor to cause a gate dielectric layer therein to collapse, so that the anti-fuse is in an "On" state. On the contrary, when no voltage is applied, the anti-fuse is in an "Off" state, thereby achieving the purpose of programming.

In order to follow the standard logic low-voltage process and comply with the design guidelines, the transistor and the anti-fuse transistor are generally manufactured using a same logic low-voltage process, and the gate dielectric layers of the two have a same thickness. However, the transistor used for writing usually needs to withstand a large voltage. Therefore, in order to prevent the transistor from collapse, it is necessary to additionally provide an external circuit for voltage reduction. In this way, the area of the overall device will be enlarged, which is not conducive to the development of high integration.

SUMMARY

The invention provides a non-volatile memory device, which does not require an additional external circuit for voltage reduction, thereby increasing device integration and improving performance of the non-volatile memory device.

The invention further provides a non-volatile memory device, so that the entire device may be turned off when an anti-fuse gate is miswritten or a leakage current is too high due to a defect, to ensure normal device performance.

The invention further provides a method for manufacturing a non-volatile memory device, which may be used to manufacture a non-volatile memory device with the foregoing effect through a standard logic low-voltage manufacturing process.

A non-volatile memory device of the invention includes a substrate, a stacked structure, an anti-fuse gate, a gate dielectric layer, a first doping region, and a second doping region. The stacked structure is formed on the substrate, and includes a floating gate, a select logic gate, a logic gate dielectric layer, and an inter-polysilicon layer dielectric layer, where the select logic gate is disposed on the floating gate, the logic gate dielectric layer is disposed between the floating gate and the substrate, and the inter-polysilicon layer dielectric layer is disposed between the floating gate and the select logic gate. The anti-fuse gate is also disposed on the substrate, and the gate dielectric layer is disposed between the anti-fuse gate and the substrate. The first doping region is formed in the substrate at one side of the floating gate. The second doping region is formed in the substrate between the floating gate and the anti-fuse gate. A channel region is formed between the second doping region and the first doping region.

Another non-volatile memory device of the invention includes a substrate, at least one first doping region formed in the substrate, a plurality of stacked structures, a plurality of second doping regions, a plurality of anti-fuse gates, and a gate dielectric layer. The stacked structures are formed on the substrate, and connected in series with each other via the first doping region, where each stacked structure includes a floating gate, a select logic gate, a logic gate dielectric layer, and an inter-polysilicon layer dielectric layer, the select logic gate being disposed on the floating gate, the logic gate dielectric layer being disposed between the floating gate and the substrate, and the inter-polysilicon layer dielectric layer being disposed between the floating gate and the select logic gate. The second doping region is formed in the substrate at one side of each floating gate. A channel region is formed between one of the second doping regions and the first doping region. The anti-fuse gate is disposed on the substrate and connected in series with one of the stacked structures via one of the second doping regions. The dielectric layer is disposed between each of the anti-fuse gates and the substrate.

In the foregoing embodiment of the invention, the floating gate includes a polysilicon gate or a metal gate.

In the foregoing embodiment of the invention, the select logic gate includes a polysilicon gate.

In the foregoing embodiment of the invention, a material of the logic gate dielectric layer may be the same as a material of the gate dielectric layer, and a thickness of the logic gate dielectric layer may also be the same as a thickness of the gate dielectric layer.

In the foregoing embodiment of the invention, the non-volatile memory device may further include an offset spacer located on a sidewall of the floating gate and on a sidewall of the anti-fuse gate.

In the foregoing embodiment of the invention, the non-volatile memory device may further include a main spacer located on a sidewall of the stacked structure.

In the foregoing embodiment of the invention, the non-volatile memory device may further include a silicide metal layer formed on a top surface of the first doping region, on a top surface of the second doping region, on a top surface of the anti-fuse gate, and on a top surface of the select logic gate.

In the foregoing embodiment of the invention, the first doping region may be coupled to a bit line.

A method for manufacturing a non-volatile memory device of the invention includes: forming a logic gate dielectric layer on a substrate; forming a first conductor layer on the logic gate dielectric layer; patterning the first conductor layer and the logic gate dielectric layer to form at least one floating gate and at least one anti-fuse gate; forming a first doping region and a second doping region in the substrate at two sides of floating gate, where the second doping region is located between the floating gate and the anti-fuse gate to connect the floating gate with the anti-fuse gate in series; forming an inter-polysilicon layer dielectric layer over the substrate to cover the floating gate and the anti-fuse gate, and forming a second conductor layer on the inter-polysilicon layer dielectric layer; and patterning the second conductor layer and the inter-polysilicon layer dielectric layer to form a select logic gate located on the floating gate. The select logic gate, the inter-polysilicon layer dielectric layer, the floating gate, and the logic gate dielectric layer form a stacked structure.

In yet another embodiment of the invention, a material of the first conductor layer includes polysilicon or metal.

In yet another embodiment of the invention, a material of the second conductor layer includes polysilicon.

In yet another embodiment of the invention, after the first conductor layer and the logic gate dielectric layer are patterned, an offset spacer may further be formed on a sidewall of the floating gate and on a sidewall of the anti-fuse gate.

In yet another embodiment of the invention, after the second conductor layer and the inter-polysilicon layer dielectric layer are patterned, a main spacer may further be formed on a sidewall of the stacked structure.

In still another embodiment of the invention, after the second conductor layer and the inter-polysilicon layer dielectric layer are patterned, a silicide metal layer may further be formed on a top surface of the first doping region, on a top surface of the second doping region, on a top surface of the anti-fuse gate, and on a top surface of the select logic gate.

In the foregoing embodiment of the invention, materials of the logic gate dielectric layer and the gate dielectric layer each independently include silicon oxide or a high-k dielectric material.

In the foregoing embodiment of the invention, a material of the inter-polysilicon layer dielectric layer includes an oxide or a nitride.

Based on the above, according to the invention, materials with different dielectric coefficients are stacked to enhance parasitic capacitance, so that such a stacked structure may withstand a high voltage. Therefore, such a high voltage resistant structure is connected in series to the anti-fuse gate, so that the device may be programmed without requiring an additional external circuit for voltage reduction, thereby increasing device integration. In addition, the stacked structure can also turn off the entire device when an anti-fuse gate is miswritten or a leakage current is too high due to a defect, to ensure normal device performance.

To make the features and advantages of the invention clear and easy to understand, the following gives a detailed description of embodiments with reference to accompanying drawings.

DESCRIPTION OF THE EMBODIMENTS

The following makes detailed description by listing embodiments and with reference to accompanying drawings, but the provided embodiments are not intended to limit the scope covered by the present invention. In addition, the drawings are drawn only for the purpose of description, and are not drawn according to original sizes. For ease of understanding, same elements in the following description are described by using same signs. Terms such as "includes", "comprises", and "having" used herein are all inclusive terms, namely, mean "includes but not limited to". In addition, the directional terms mentioned herein, like "above" and "below", refer to the directions in the appended drawings. Therefore, the directional terms are only used for illustration instead of limiting the present invention.

Figure 1:
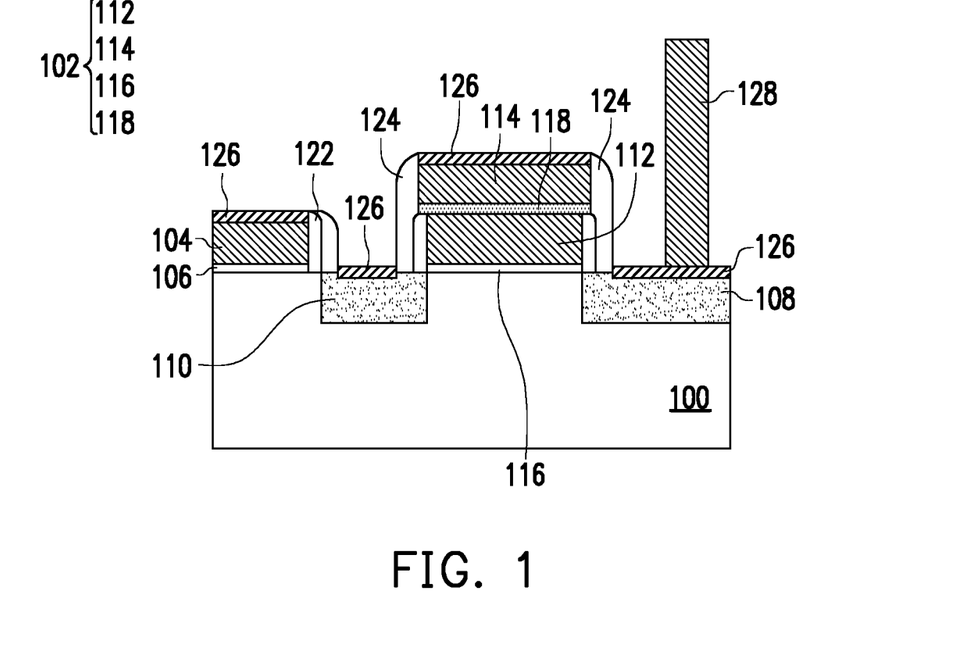
FIG. 1 is a schematic cross-sectional view of a non-volatile memory device according to a first embodiment of the invention.

FIG. 1 is a schematic cross-sectional view of a non-volatile memory device according to a first embodiment of the invention.

Referring to FIG. 1, a non-volatile memory device of the first embodiment includes a substrate 100, a stacked structure 102, an anti-fuse gate 104, a gate dielectric layer 106, a first doping region 108, and a second doping region 110. The stacked structure 102 and the anti-fuse gate 104 are both formed on the substrate 100, and connected in series via the second doping region 110. The stacked structure 102 includes a floating gate 112, a select logic gate 114, a logic gate dielectric layer 116, and an inter-polysilicon layer dielectric layer 118. The select logic gate 114 is disposed above the floating gate 112, the logic gate dielectric layer 116 is disposed between the floating gate 112 and the substrate 100, and the inter-polysilicon layer dielectric layer 118 is disposed between the floating gate 112 and the select logic gate 114. Since the substrate 100, the logic gate dielectric layer 116, the floating gate 112, the inter-polysilicon layer dielectric layer 118, and the select logic gate 114 each have different dielectric coefficients, for example, an SONOS device, so that parasitic capacitance is increased, the stacked structure 102 can withstand a high voltage. In one embodiment of a logic consumer electronics application, the stacked structure 102 can withstand a high voltage of 11V at the maximum. In another embodiment, the stacked structure 102 can withstand a high voltage of 8V at the maximum.

The anti-fuse gate 104 may be a polysilicon gate or a metal (such as tungsten, titanium, cobalt) gate, and may be used with silicon oxide or a high-k dielectric material as the gate dielectric layer 106. The high-k dielectric material is, for example, $HfO_2$, HfSiON, AlN, or $Al_2O_3$. The floating gate 112 may also be a polysilicon gate or a metal gate, and may be used with silicon oxide or a high-k dielectric material as the logic gate dielectric layer 116. For the material selection, reference may be made to the anti-fuse gate 104 and the gate dielectric layer 106, the descriptions thereof are omitted. The select logic gate 114 is preferably a polysilicon gate, and from the cross-section of FIG. 1, a width of the select logic gate 114 is greater than that of the floating gate 112. The inter-polysilicon layer dielectric layer 118 is made of, for example, an oxide or a nitride, and is preferably made of a silicon oxide formed by tetraethyl orthosilicate glass (TEOS). In terms of process integration, the logic gate dielectric layer 116 and the gate dielectric layer 106 in the present embodiment may be formed simultaneously using the same process, and the anti-fuse gate 104 and the floating gate 112 may also be formed simultaneously using the same process. In other words, the logic gate dielectric layer 116 and the gate dielectric layer 106 may be made of a same material, and the logic gate dielectric layer 116 may also have a same thickness as the gate dielectric layer 106. Similarly, the anti-fuse gate 104 and the floating gate 112 may also be made of the same material and have the same thickness. However, the invention is not limited thereto. In another embodiment, the foregoing structure may also be manufactured using different processes. In an 80 nm process, a thickness of the logic gate dielectric layer 116 is about several tens of angstroms (Å), such as 20 Å to 90 Å. A thickness of polysilicon of the floating gate 112 is about 40 nm to 200 nm. A thickness of the inter-polysilicon layer dielectric layer 118 is about 5 nm to 30 nm. A thickness of the select logic gate 114 is about several tens of nanometers, such as 20 Å to 90 Å.

Still referring to FIG. 1, the second doping region 110 is formed in the substrate 100 between the anti-fuse gate 104 and the floating gate 112, and the first doping region 108 is formed in the substrate 100 at the other side of the floating gate 112, a channel region (not shown) being formed between the second doping region 110 and the first doping region 108. If the substrate 100 is a P-type silicon substrate, the first doping region 108 and the second doping region 110 may be N+ regions, and vice versa. That is, when the substrate 100 is a P-type silicon substrate, the first doping region 108 and the second doping region 110 may be P+ regions. In the present embodiment, an offset spacer 122 may further be provided on a sidewall of the floating gate 112 and on a sidewall of the anti-fuse gate 104, and a main spacer 124 may further be formed on a sidewall of the stacked structure 102 and outside the offset spacer 122, to protect an internal conductor structure such as the select logic gate 114, the floating gate 112, and the anti-fuse gate 104. However, the invention is not limited thereto, and the offset spacer 122 and/or the main spacer 124 may alternatively be omitted. In addition, in order to improve electric conductivity, a silicide metal layer 126 may further be formed in a self-aligned manner on a top surface of the first doping region 108, on a top surface of the second doping region 110, on a top surface of the anti-fuse gate 104, and on a top surface of the select logic gate 114. The silicide metal layer 126 is made of, for example, tungsten silicide, titanium silicide, cobalt silicide, tantalum silicide, nickel silicide, platinum silicide, or palladium silicide. However, the invention is not limited thereto, and the silicide metal layer 126 may alternatively be omitted.

Before the programming operation, since the width of the select logic gate 114 is slightly greater than that of the floating gate 112, the offset spacer 122 on the sidewall of the floating gate 112 generates capacitance with the select logic gate 114, which may improve program disturb. Therefore, after the programming operation, the original anti-fuse gate 104 is transformed into a resistor, and the floating gate 112 and the select logic gate 114 may be used as a reading unit to improve reading disturbance from which only a single gate suffers. Since the non-volatile memory device has a programmable voltage of about 5V to 8V, the overall device may be designed by following the design of a low-voltage device. In comparison to the similar device at present, the size of the device may be greatly reduced.

Figure 2:
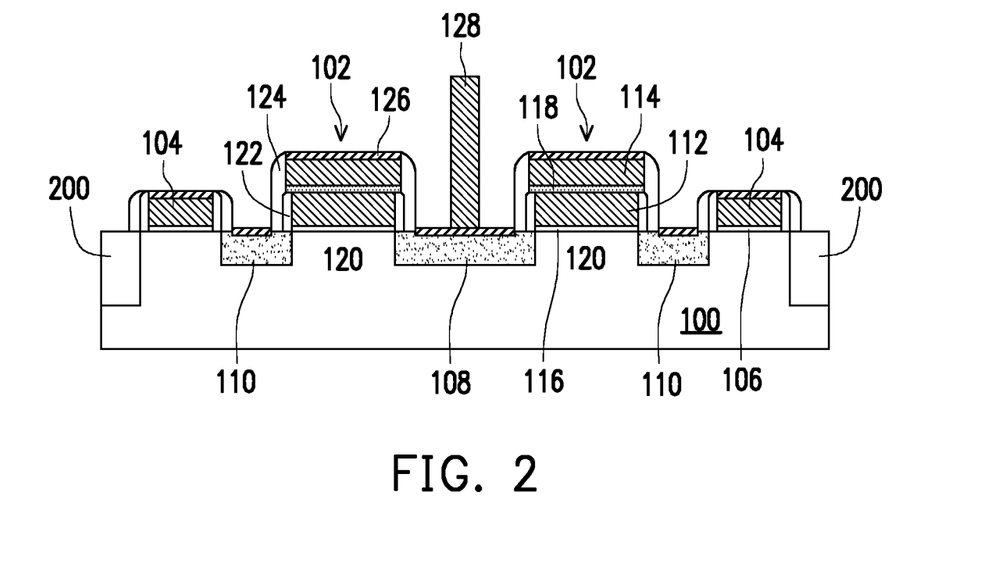
FIG. 2 is a schematic cross-sectional view of a non-volatile memory device according to a second embodiment of the invention.

FIG. 2 is a schematic cross-sectional view of a non-volatile memory device according to a second embodiment of the invention. Device symbols in FIG. 1 are used to represent the same or similar components, and for the description of the same components, reference may be made to the related content of FIG. 1, and the descriptions thereof are omitted herein.

Referring to FIG. 2, the non-volatile memory device of the second embodiment also includes a substrate 100, and usually has an isolation structure 200 in the substrate 100, for example, a shallow trench isolation structure (STI), to define an active region of the memory device. A difference between the second embodiment and the first embodiment lies in that there are two stacked structures 102 and two anti-fuse gates 104, and two channel regions 120 are formed in the substrate 100 between the second doping region 110 and the first doping region 108, respectively. In addition, the two stacked structures 102 share one first doping region 108, and two second doping regions 110 are located between one anti-fuse gate 104 and one stacked structure 102, respectively, to connect one anti-fuse gate 104 with one stacked structure 102 in series via the second doping region 110. The design of the anti-fuse gate 104, the select logic gate 114, and the floating gate 112 of the non-volatile memory device of the second embodiment has a similar effect in improving the programming disturbance or the reading disturbance as that of the previous embodiment, and therefore the descriptions thereof are omitted herein.

FIG. 3A to FIG. 3G are schematic diagrams of a manufacturing process of a non-volatile memory device according to a third embodiment of the invention.

Figure 3A:
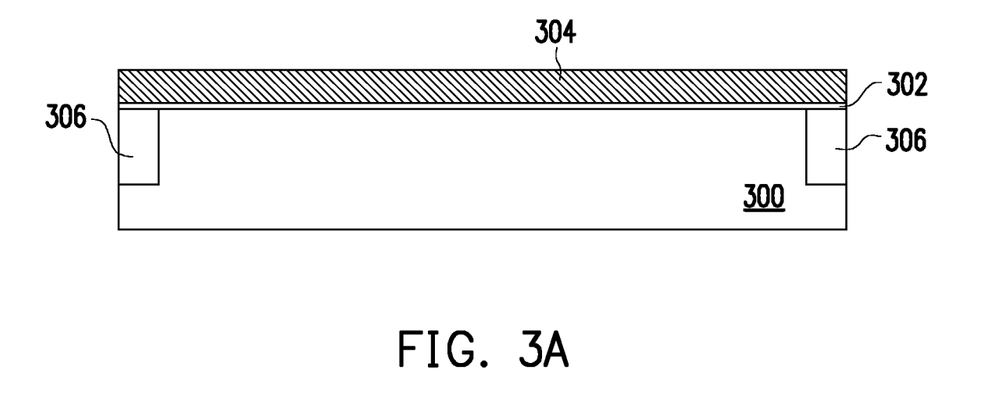
FIG. 3A to FIG. 3G are schematic diagrams of a manufacturing process of a non-volatile memory device according to a third embodiment of the invention.

First referring to FIG. 3A, a logic gate dielectric layer 302 is formed on a substrate 300, and a first conductor layer 304 is formed on the logic gate dielectric layer 302. An isolation structure 306 such as a shallow trench isolation structure (STI) is formed in the substrate 100, to define an active region of the memory device. A first conductor layer 304 is made of polysilicon or metal, and a method for forming same includes performing a chemical vapor deposition process. In one embodiment, if the first conductor layer 304 is made of polysilicon, an undoped polysilicon layer may be deposited first, and then dopants are implanted into the polysilicon layer using an ion implantation method. Alternatively, an in-situ method is used, when polysilicon is deposited, a gas containing a required dopant is added, and a doped polysilicon layer is obtained upon completion. The logic gate dielectric layer 302 is made of silicon oxide or a high-k dielectric material, and a method for forming same includes performing a thermal oxidation method or a chemical vapor deposition process.

Figure 3B:
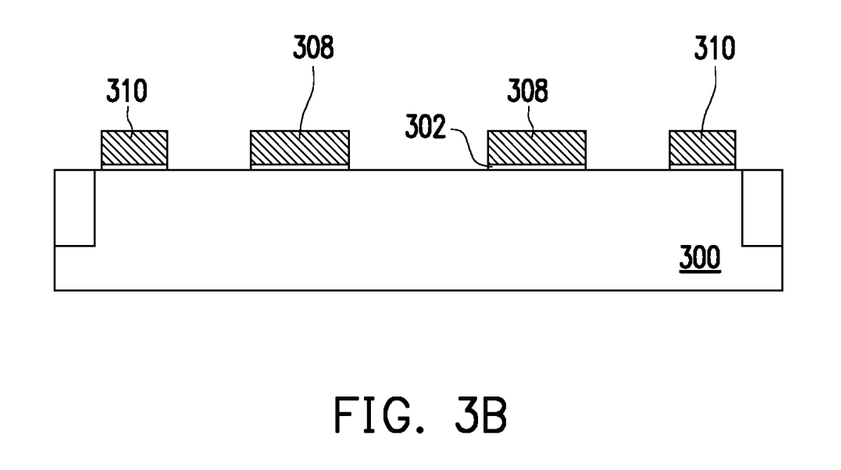

Then, referring to FIG. 3B, the first conductor layer 304 and the logic gate dielectric layer 302 are patterned to form a floating gate 308 and an anti-fuse gate 310, and a logic gate dielectric layer below the anti-fuse gate may be used as a gate dielectric layer. The patterning step is, for example, forming a patterned photoresist (not shown) or a patterned hard mask (not shown) on the first conductor layer 304, and then using the layer as an etching mask to remove the unshielded first conductor layer 304 below and the logic gate dielectric layer 302 below. Since the floating gate 308 and the anti-fuse gate 310 may be manufactured using the same process and may be integrated into an existing process, the process may be simplified and costs may be reduced.

Figure 3C:
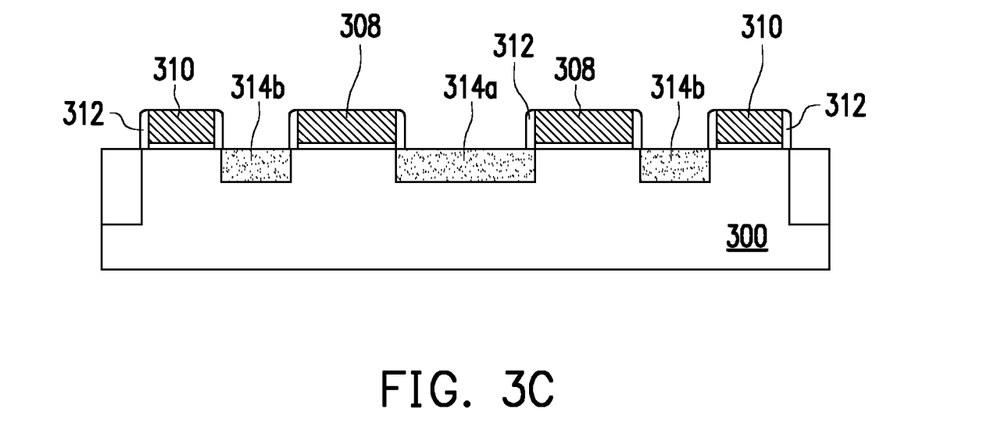

Then referring to FIG. 3C, an offset spacer 312 may be formed on a sidewall of the floating gate 308 and on a sidewall of the anti-fuse gate 310. The offset spacer 312 is made of, for example, silicon oxide, silicon nitride, or silicon oxynitride, and a method for forming same includes first performing a chemical vapor deposition process and then performing an anisotropic etching process. Then, a first doping region 314a and a second doping region 314b are formed in the substrate 300 at two sides of the floating gate 308, and a method for forming same includes performing an ion implantation process. The second doping region 314b is located between the floating gate 308 and the anti-fuse gate 310 to connect the floating gate 308 with the anti-fuse gate 310 in series. In the first doping region 314a and the second doping region 314b in FIG. 3C, an LDD region (not shown) may be formed using an LDD process before the offset spacer 312 is formed, and after the offset spacer 312 is formed, heavy doping regions (such as 314a and 314b) are formed using the ion implantation process.

Figure 3D:
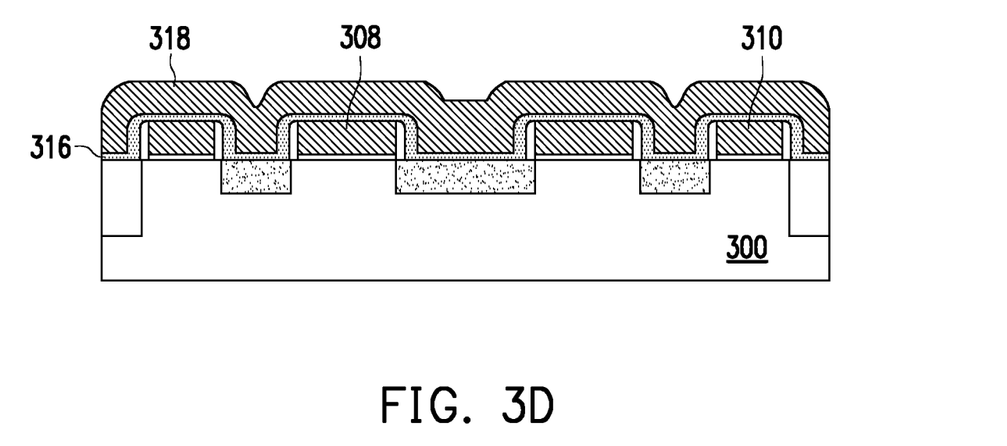

Then referring to FIG. 3D, an inter-polysilicon layer dielectric layer 316 is formed over the substrate 300 to cover the floating gate 308 and the anti-fuse gate 310, and a second conductor layer 318 is formed on the inter-polysilicon layer dielectric layer 316. The inter-polysilicon layer dielectric layer 316 is made of an oxide or a nitride, and a method for forming the inter-polysilicon layer dielectric layer 316 includes performing a chemical vapor deposition process. For example, the inter-polysilicon layer dielectric layer 316 may be a silicon oxide formed using tetraethyl orthosilicate (TEOS) glass. The second conductor layer 318 is made of polysilicon, and a method for forming same includes performing a chemical vapor deposition process.

Figure 3E:
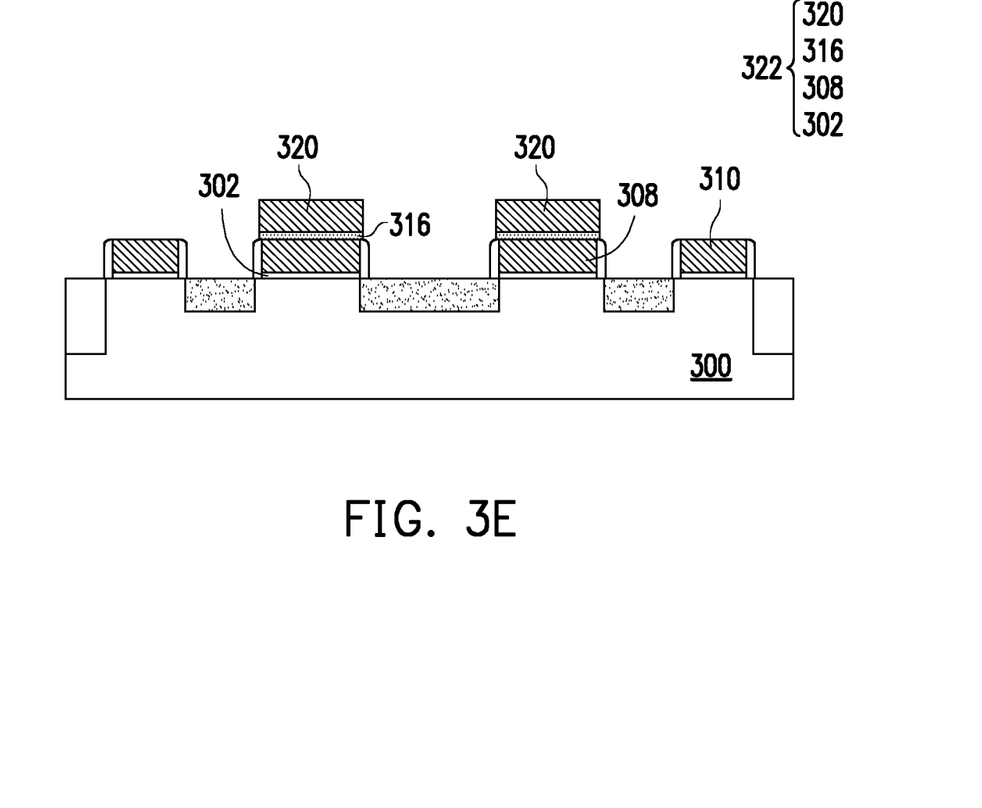

Then, referring to FIG. 3E, a second conductor layer 318 and an inter-polysilicon layer dielectric layer 316 are patterned, to form a select logic gate 320 located on the floating gate 308. The patterning step is, for example, forming a patterned photoresist (not shown) or a patterned hard mask (not shown) on the second conductor layer 318, and then using the layer as an etching mask to remove the unshielded second conductor layer 318 below and the inter-polysilicon layer dielectric layer 316 below. A stacked structure 322 is formed by the select logic gate 320, the inter-polysilicon layer dielectric layer 316, the floating gate 308, and the logic gate dielectric layer 302.

Figure 3F:
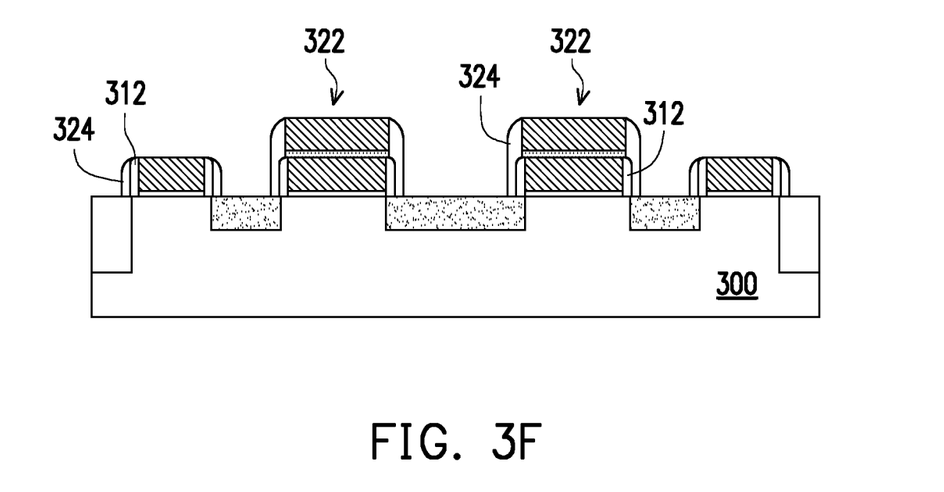

Then referring to FIG. 3F, upon completion of manufacturing the non-volatile memory device of the third embodiment, a main spacer 324 may further be formed on a sidewall of the stacked structure 322. The main spacer 324 is formed by, for example, first depositing a dielectric layer or an insulation layer on the substrate 300, and then through anisotropic etching or etching back to remove the dielectric layer or the insulation layer on a horizontal plane. Therefore, the main spacer 324 is also formed outside the offset spacer 312 on a sidewall of the anti-fuse gate 310.

Figure 3G:
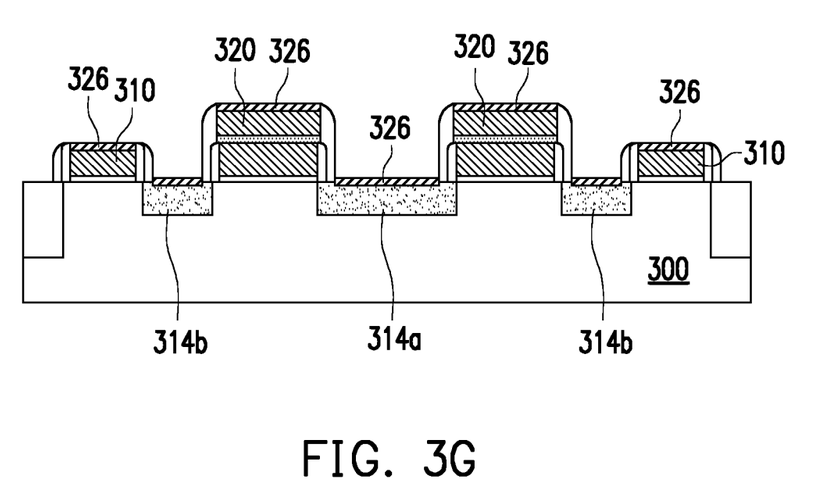

Then referring to FIG. 3G, in order to improve electric conductivity, a silicide metal layer 326 may further be formed in a self-aligned manner on a top surface of the first doping region 314a, on a top surface of the second doping region 314b, on a top surface of the anti-fuse gate 310, and on a top surface of the select logic gate 320. The silicide metal layer 326 is made of, for example, tungsten silicide, titanium silicide, cobalt silicide, tantalum silicide, nickel silicide, platinum silicide, or palladium silicide. The method for forming the silicide metal layer 326 is, for example, first depositing a metal layer (not shown) on the substrate 300, and then a metal silicide is formed using high temperature to cause the metal layer to react with the underlying silicon (such as silicon substrates of the first doping region 314a and the second doping region 314b and polysilicon of the anti-fuse gate 310 and the select logic gate 320), and then the unreacted remaining metal is removed. If the anti-fuse gate 310 is a metal gate, a metal silicide is not formed on a top surface thereof.

Based on the above, according to the invention, in the one-time programmable (OTP) read-only memory with an anti-fuse gate, structures of different dielectric constant materials are stacked via connection in series, so that the device is programmed. In addition, since the stacked structure can withstand a high voltage, such a high voltage resistant structure can be used to increase device integration without requiring an additional external circuit for voltage reduction. In addition, the stacked structure can also turn off the entire device when an anti-fuse gate is miswritten or a leakage current is too high due to a defect, to ensure normal device performance.

Although the invention is described with reference to the above embodiments, the embodiments are not intended to limit the invention. A person of ordinary skill in the art may make variations and modifications without departing from the spirit and scope of the invention. Therefore, the protection scope of the invention should be subject to the appended claims.

What is claimed is:

1. A non-volatile memory device, comprising:
   a substrate;
   an isolation structure disposed in the substrate to define an active region;
   a stacked structure formed on the substrate and comprising:
      a floating gate;
      a select logic gate disposed on the floating gate, wherein a width of the select logic gate is greater than a width of the floating gate;
      a logic gate dielectric layer disposed between the floating gate and the substrate; and
      an inter-polysilicon layer dielectric layer disposed between the floating gate and the select logic gate;
   an anti-fuse gate disposed on the substrate, wherein one side of the anti-fuse gate is close to the isolation structure, and no doping region is formed in the substrate between the one side of the anti-fuse gate and the isolation structure;
   a gate dielectric layer disposed between the anti-fuse gate and the substrate;
   a first doping region formed in the substrate at one side of the floating gate; and
   a second doping region formed in the substrate between the floating gate and the other side of the anti-fuse gate, wherein a channel region is formed between the second doping region and the first doping region.

2. The non-volatile memory device according to claim 1, wherein the floating gate comprises a polysilicon gate or a metal gate.

3. The non-volatile memory device according to claim 1, wherein the select logic gate comprises a polysilicon gate.

4. The non-volatile memory device according to claim 1, wherein a material of the inter-polysilicon layer dielectric layer comprises an oxide or a nitride.

5. The non-volatile memory device according to claim 1, wherein a material of the logic gate dielectric layer is the same as a material of the gate dielectric layer, and a thickness of the logic gate dielectric layer is the same as a thickness of the gate dielectric layer.

6. The non-volatile memory device according to claim 1, wherein materials of the logic gate dielectric layer and the gate dielectric layer each independently comprise silicon oxide or a high-k dielectric material.

7. The non-volatile memory device according to claim 1, further comprising an offset spacer located on a sidewall of the floating gate and on a sidewall of the anti-fuse gate.

8. The non-volatile memory device according to claim 1, further comprising a main spacer located on a sidewall of the stacked structure.

9. The non-volatile memory device according to claim 1, further comprising a silicide metal layer formed on a top surface of the first doping region, on a top surface of the second doping region, on a top surface of the anti-fuse gate, and on a top surface of the select logic gate.

10. The non-volatile memory device according to claim 1, wherein the first doping region is coupled to a bit line.

11. A non-volatile memory device, comprising:
a substrate;
an isolation structure disposed in the substrate to define an active region;
at least one first doping region formed in the substrate;
a plurality of stacked structures formed on the substrate and connected in series with each other via the at least one first doping region, wherein each of the stacked structures comprises:
a floating gate;
a select logic gate disposed on the floating gate, wherein a width of the select logic gate is greater than a width of the floating gate;
a logic gate dielectric layer disposed between the floating gate and the substrate; and
an inter-polysilicon layer dielectric layer disposed between the floating gate and the select logic gate;
a plurality of second doping regions formed in the substrate at one side of the floating gate, wherein a channel region is formed between one of the second doping regions and the at least one first doping region;
a plurality of anti-fuse gates disposed on the substrate and connected in series with one of the stacked structures via one of the second doping regions, wherein one side of the anti-fuse gates is close to the isolation structure, and no doping region is formed in the substrate between the one side of the anti-fuse gates and the isolation structure; and
a gate dielectric layer disposed between each of the anti-fuse gates and the substrate.

12. The non-volatile memory device according to claim 11, wherein the floating gate comprises a polysilicon gate or a metal gate.

13. The non-volatile memory device according to claim 11, wherein the select logic gate comprises a polysilicon gate.

14. The non-volatile memory device according to claim 11, wherein a material of the inter-polysilicon layer dielectric layer comprises an oxide or a nitride.

15. The non-volatile memory device according to claim 11, wherein a material of the logic gate dielectric layer is the same as a material of the gate dielectric layer, and a thickness of the logic gate dielectric layer is the same as a thickness of the gate dielectric layer.

16. The non-volatile memory device according to claim 11, wherein materials of the logic gate dielectric layer and the gate dielectric layer each independently comprise silicon oxide or a high-k dielectric material.

17. The non-volatile memory device according to claim 11, further comprising an offset spacer located on a sidewall of the floating gate and on a sidewall of the anti-fuse gate.

18. The non-volatile memory device according to claim 11, further comprising a main spacer located on a sidewall of the stacked structure.

19. The non-volatile memory device according to claim 11, further comprising a silicide metal layer formed on a top surface of the first doping region, on a top surface of the second doping region, on a top surface of the anti-fuse gate, and on a top surface of the select logic gate.

20. The non-volatile memory device according to claim 11, wherein the first doping region is coupled to a bit line.

21. A method for manufacturing a non-volatile memory device, comprising:
forming an isolation structure in a substrate to define an active region;
forming a logic gate dielectric layer on the substrate;
forming a first conductor layer on the logic gate dielectric layer;
patterning the first conductor layer and the logic gate dielectric layer to form at least one floating gate and at least one anti-fuse gate, wherein one side of the at least one anti-fuse gate is close to the isolation structure;
forming a first doping region and a second doping region in the substrate at two sides of the floating gate, wherein the second doping region is located between the floating gate and the other side of the anti-fuse gate to connect the floating gate with the anti-fuse gate in series, and no doping region is formed in the substrate between the one side of the at least one anti-fuse gate and the isolation structure;
forming an inter-polysilicon layer dielectric layer over the substrate to cover the floating gate and the anti-fuse gate;
forming a second conductor layer on the inter-polysilicon layer dielectric layer; and
patterning the second conductor layer and the inter-polysilicon layer dielectric layer to form a select logic gate located on the floating gate, wherein the select logic gate, the inter-polysilicon layer dielectric layer, the floating gate, and the logic gate dielectric layer form a stacked structure, and a width of the select logic gate is greater than a width of the floating gate.

22. The method for manufacturing the non-volatile memory device according to claim 21, wherein a material of the logic gate dielectric layer comprises silicon oxide or a high-k dielectric material.

23. The method for manufacturing the non-volatile memory device according to claim 21, wherein a material of the first conductor layer comprises polysilicon or metal.

24. The method for manufacturing the non-volatile memory device according to claim 21, wherein a material of the inter-polysilicon layer dielectric layer comprises an oxide or a nitride.

25. The method for manufacturing the non-volatile memory device according to claim 21, wherein a material of the second conductor layer comprises polysilicon.

26. The method for manufacturing the non-volatile memory device according to claim 21, wherein after patterning the first conductor layer and the logic gate dielectric layer, the method further comprises: forming an offset spacer on a sidewall of the floating gate and a sidewall of the anti-fuse gate.

27. The method for manufacturing the non-volatile memory device according to claim 21, wherein after patterning the second conductor layer and the inter-polysilicon layer dielectric layer, the method further comprises: forming a main spacer on a sidewall of the stacked structure.

28. The method for manufacturing the non-volatile memory device according to claim 21, wherein after patterning the second conductor layer and the inter-polysilicon layer dielectric layer, the method further comprises: forming a silicide metal layer on a top surface of the first doping region, on a top surface of the second doping region, on a top surface of the anti-fuse gate, and on a top surface of the select logic gate.

* * * * *